(12) United States Patent
Dewdney

(10) Patent No.: US 6,683,458 B2
(45) Date of Patent: Jan. 27, 2004

(54) MAGNETIC RESONANCE APPARATUS WITH SELECTIVELY ACTIVATABLE ISOLATION MECHANISM

(75) Inventor: Andrew Dewdney, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/263,100

(22) Filed: Oct. 2, 2002

(65) Prior Publication Data

US 2003/0085705 A1 May 8, 2003

(30) Foreign Application Priority Data

Oct. 2, 2001 (DE) .......................... 101 48 619

(51) Int. Cl.[7] .............................................. G01V 3/00
(52) U.S. Cl. ...................................... 324/318; 324/322
(58) Field of Search ................................ 324/318, 322, 324/300, 306, 307, 309, 312, 314

(56) References Cited

U.S. PATENT DOCUMENTS

| 5,081,991 | A | | 1/1992 | Chance | |
|---|---|---|---|---|---|
| 5,129,232 | A | | 7/1992 | Minas et al. | |
| 5,617,026 | A | * | 4/1997 | Yoshino et al. | 324/318 |
| 6,043,653 | A | * | 3/2000 | Takamori et al. | 324/309 |
| 6,169,404 | B1 | * | 1/2001 | Eckels | 324/320 |
| 6,433,550 | B1 | * | 8/2002 | Kinanen | 324/320 |

FOREIGN PATENT DOCUMENTS

| DE | 198 20 570 | 11/1999 |
|---|---|---|
| DE | 100 48 340 | 5/2002 |

* cited by examiner

Primary Examiner—Louis Arana
(74) Attorney, Agent, or Firm—Schiff Hardin & Waite

(57) ABSTRACT

A magnetic resonance apparatus has a controllable device with which at least a part of the magnetic resonance apparatus can be fixed in a first control statue and with which the part can be held isolated with respect to mechanical oscillations in a second control statue.

18 Claims, 5 Drawing Sheets

MAGNETIC RESONANCE APPARATUS WITH SELECTIVELY ACTIVATABLE ISOLATION MECHANISM

BACKGROUND OF THE INVENTION

1. Field of the Invention

The present invention is directed to a magnetic resonance apparatus, and in particular to a magnetic resonance apparatus having vibration damping.

2. Description of the Prior Art

Magnetic resonance technology is a known technique for, among other things, acquiring images of the inside of the body of an examination subject. In a magnetic resonance apparatus, rapidly switched gradient fields that are generated by a gradient system are superimposed on a static basic magnetic field that is generated by a basic field magnet. The magnetic resonance apparatus also includes a radio-frequency system that emits radio-frequency signals into the examination subject for triggering magnetic resonance signals and picks up the triggered magnetic resonance signals, from which magnetic resonance images are produced.

A magnetic resonance apparatus has an examination space in which a region of the examination subject to be imaged is positioned for producing magnetic resonance images of a selected region. To that end, the magnetic resonance apparatus usually comprises at least one support mechanism that is displaceable in a direction into and out of the examination space and on which the examination subject can be borne. By moving the support mechanism together with the examination subject seated thereon, positioning of the region to be imaged in the examination space is undertaken.

For example, U.S. Pat. No. 5,129,232 discloses a superconductive basic field magnet with a cryohead for a magnetic resonance apparatus. The operating cryohead is thereby known as a generator of mechanical oscillations that are transmitted onto the basic field magnet which have a negative influence on the uniformity (homogeneity) of the basic magnetic field as well as on the image resolution of the magnetic resonance apparatus. As a result undesired artifacts are produced in the magnetic resonance images. The vibrations generated by the cryohead typically have a dominant frequency of a few Hz.

Further, it is known that similar low-frequency mechanical oscillations having the above-described disadvantages can also be transmitted, for example, from the floor of the installation room of a magnetic resonance apparatus to the magnetic resonance apparatus. The aforementioned structure oscillations can be produced, for example, by neighboring street traffic and/or rail traffic and/or by other generators of mechanical oscillations arranged in the same building.

SUMMARY OF THE INVENTION

An object of the present invention is to provide an improved magnetic resonance apparatus with which, among other things, mechanical oscillations emanating from the environment wherein the magnetic resonance apparatus is installed can be rapidly and highly effectively damped in the direction of the magnetic resonance apparatus during the image pick-up mode of the magnetic resonance apparatus.

The above object is achieved in accordance with the principles of the present invention in a magnetic resonance apparatus having a controllable device with which at least a part of the magnetic resonance apparatus can be fixed in a first control state and with which the part can be held isolated, with respect to mechanical oscillations, in a second controlled state.

The invention is based on the perception that in a magnetic resonance apparatus having a damping mechanism for damping low-frequency mechanical oscillations between a part of the magnetic resonance apparatus and the environment wherein it is installed, low-frequency mechanical oscillations are also produced by a displacement of the support mechanism connected to the aforementioned part of the magnetic resonance apparatus. As a result, the damping mechanism during the actual generation of magnetic resonance images which immediately follows after the end of the displacement of the support mechanism, is still experiencing oscillations due to the displacement due to a comparatively long time constant of the damping mechanism for low-frequency oscillations. The full damping effect of the damping mechanism thus is not available for the actual magnetic resonance imaging. This situation for the displacement of the support mechanism also applies similarly to the procedure for positioning an examination subject on the support mechanism, removing the examination subject from the support mechanism as well as connection and disconnection of an active damping mechanism, for example in an embodiment as a controllable air cushion or a damping mechanism having piezo-electric elements.

The controllable device, with which the part of the magnetic resonance apparatus is fixed so as to be immobile relative to the surrounding structure during a time wherein the magnetic resonance apparatus is not operated with an imaging sequence or a spectroscopic sequence, therefore is arranged between this part of the magnetic resonance apparatus and a surrounding structure. As a result, a motion of the part relative to the surrounding structure is suppressed during this time. The aforementioned time duration particularly covers the above-described displacement of the support mechanism, the positioning and removal of the examination subject, the connection and disconnection of the active damping mechanism and further standstill times, for example standstill times at night, as well as times wherein maintenance of the magnetic resonance apparatus is implemented. In contrast, low-frequency mechanical oscillations emanating from the installation environment are highly effectively damped by the controllable device and, thus, disturbances of operations are prevented during imaging or stereoscopic sequence wherein the controllable device is in its second control status and has its full damping effect available.

DESCRIPTION OF THE PREFERRED EMBODIMENTS

Figure 1:
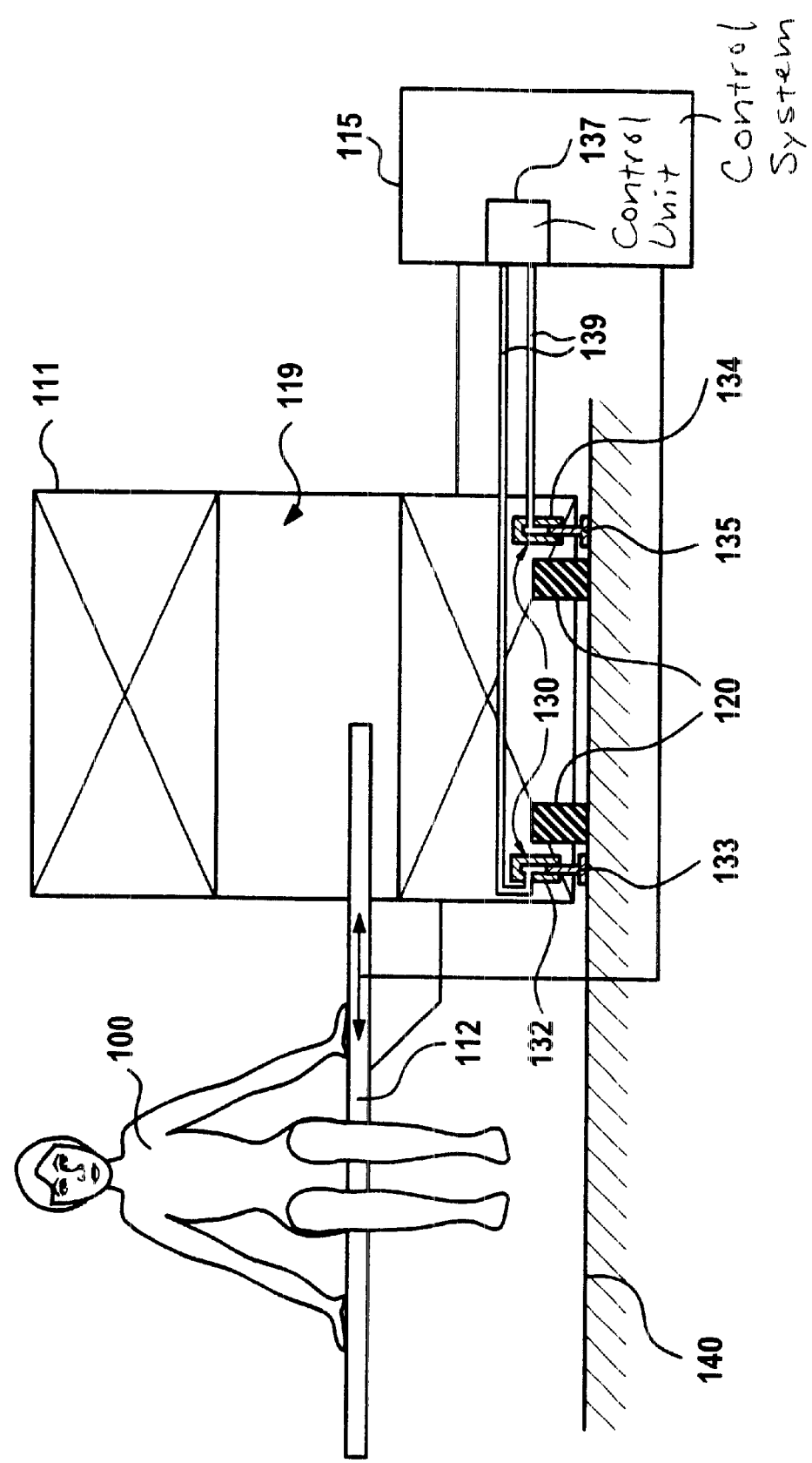
FIG. 1 is a longitudinal section through a magnetic resonance apparatus having a damping mechanism and an activated fixing mechanism in accordance with the invention.

As an exemplary embodiment of the invention, FIG. 1 shows a longitudinal section through a magnetic resonance apparatus having a damping mechanism 120 and an activated fixing mechanism 130. The magnetic resonance apparatus thereby an essentially hollow-cylindrical base unit 111 with a hollow interior in which an examination space 119 is arranged. The basic unit 111 has a superconducting basic field magnetic for generating a static basic magnetic field, a permanently installed gradient coil system for generating gradient fields, and an antenna system that is likewise permanently installed for transmitting radio-frequency signals as well as for receiving magnetic resonance signals. For introducing an examination subject into the examination space 119, the magnetic resonance apparatus also has a displaceable support mechanism 112 that is secured to the basic unit 111.

The basic unit 111 together with the support mechanism 112 secured thereto is mounted on a floor 140 of an installation room of the magnetic resonance apparatus via the damping mechanism 120. The damping mechanism 120 is divided in four, and each of the four parts is essentially fashioned of a visco-elastic material, for example rubber, that absorbs mechanical oscillations. The fixing mechanism 130, which is likewise fashioned in four parts, is arranged parallel to the damping mechanism 120. Each of the four parts of the fixing mechanism 130 has a thruster 132 or 134 for guiding a plunger 133 or 135, so the plunger 133 or 135 can be extended in the direction of the building floor 140 from the thruster 132 or 134 by impressing a hydraulic fluid or with compressed air 139.

The components of the basic unit 111, the displaceable support mechanism 112 and the fixing mechanism 130 are connected to a control system 115 for coordinated thereof. The control system 115 thereby comprises a control unit 137 with which the plungers 133 and 135 are movable by modifying the pressure of the hydraulic fluid or the compressed air 139.

The displaceable support mechanism 112 has been moved out of the examination space 119 so that a patient 100 as an examination subject can initially sit comfortably on the support mechanism 112 for being placed onto the support mechanism 112. The plungers 133 and 135 of the fixing mechanism 130 are extended with maximum pressure against the floor 140, so that the basic unit 111 together with the support mechanism 112 secured thereto is supported immobile and undamped against the floor 140. The ascent of the patient 100 as well as the subsequent displacement of the support mechanism 112 together with the patient 100 borne thereon into the examination space 119 therefore does not cause any response of the damper mechanism 120 because this is relieved by the correspondingly actuated fixing mechanism 130. If the fixing mechanism 130 were not present or the plungers 133 and 135 of the fixing mechanism 130 were not extended with high pressure against the floor 140, then both the ascent of the patient 100 as well as the subsequent displacement of the bearing mechanism 120 thereupon would cause the damping mechanism 120 to perform a compensating reaction wherein the basic unit 111 together with the support mechanism 112 would move in oscillatory fashion relative to the floor 140. Particularly given a design of the damping mechanism 120 for absorbing low-frequency mechanical oscillations from approximately 1 through 15 Hz, the aforementioned oscillations could only be dismantled with a comparatively long time constant so that this oscillation would have a disturbing influence on an image pickup mode that immediately follows a completed displacement of the support mechanism 112. Likewise, the ascent of the patient 110 would cause a canting of the basic unit 111 toward the left side because the left part of the damping mechanism 120 would be more highly deformed than the right part. This would cause an oscillation of the basic unit 111 relative to the floor 140 no later than the displacement of the support mechanism 112 due to a compensating reaction to the deformation of different degrees, which would in turn have a disturbing influence on the subsequent magnetic resonant image production.

Figure 2:
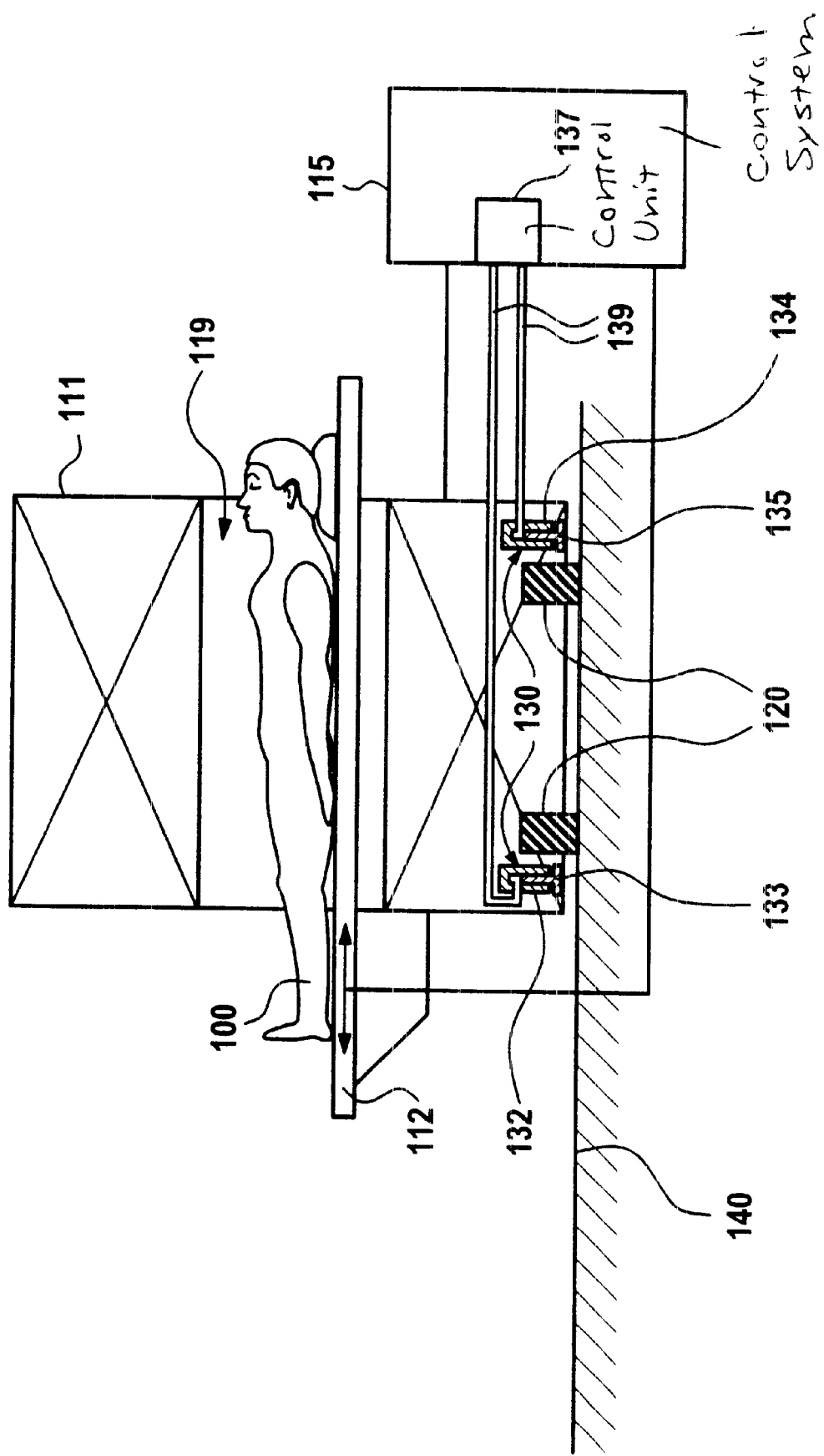
FIG. 2 is a longitudinal section through the magnetic resonance apparatus when the fixing mechanism is deactivated.

After a region of the patient 100 to be imaged, for example an abdominal region has been positioned in the examination space 119 by a suitable displacement of the support mechanism 112 together with the patient 100 lying thereon, the pressure of the hydraulic fluid or the compressed air 139 is gradually reduced before the start of an imaging sequence, controlled by the control system 115 via its control unit 137, so that the plungers 133 and 135 are brought into the position shown in FIG. 2. The basic unit 111 including the support mechanism 112 secured thereto and carrying the patient 100 are then connected to the floor 140 via the damping mechanism 120, so that mechanical oscillations proceeding from the floor 140 upon implementation of the imaging sequence and having, for example, a frequency between approximately 1 and 15 Hz, are effectively damped by the damping mechanism 120. Transmission of the oscillations to the basic unit 11 together with the support mechanism 112 and the patient 110 is thus prevented, and the quality of the magnetic resonance images generated with the imaging sequence is not negatively affected.

After the magnetic resonance image pickup has ended and before the support 2 is withdrawn to patient 110 can descend or has been moved into a different position, the fixing mechanism 130 is activated again and is not deactivated again until immediately before a start of the next imaging or spectroscopic sequence.

In another embodiment, the fixing mechanism 130 is fashioned as a controllable mechanism with which the basic unit 111 can be fixed in a first control status and can be kept isolated in view of mechanical isolations in a second control status, so that the damping mechanism 120 is dispensable. To that end, the plungers 133 and 135 are extended in the first control statue with high pressure against the floor 140. In a second control statue, the plungers 133 and 135 are extended with pressure against the floor 140 that is capable of carrying the basic unit 111 in insulating fashion, particularly as to low-frequency mechanical oscillations.

Figure 3:
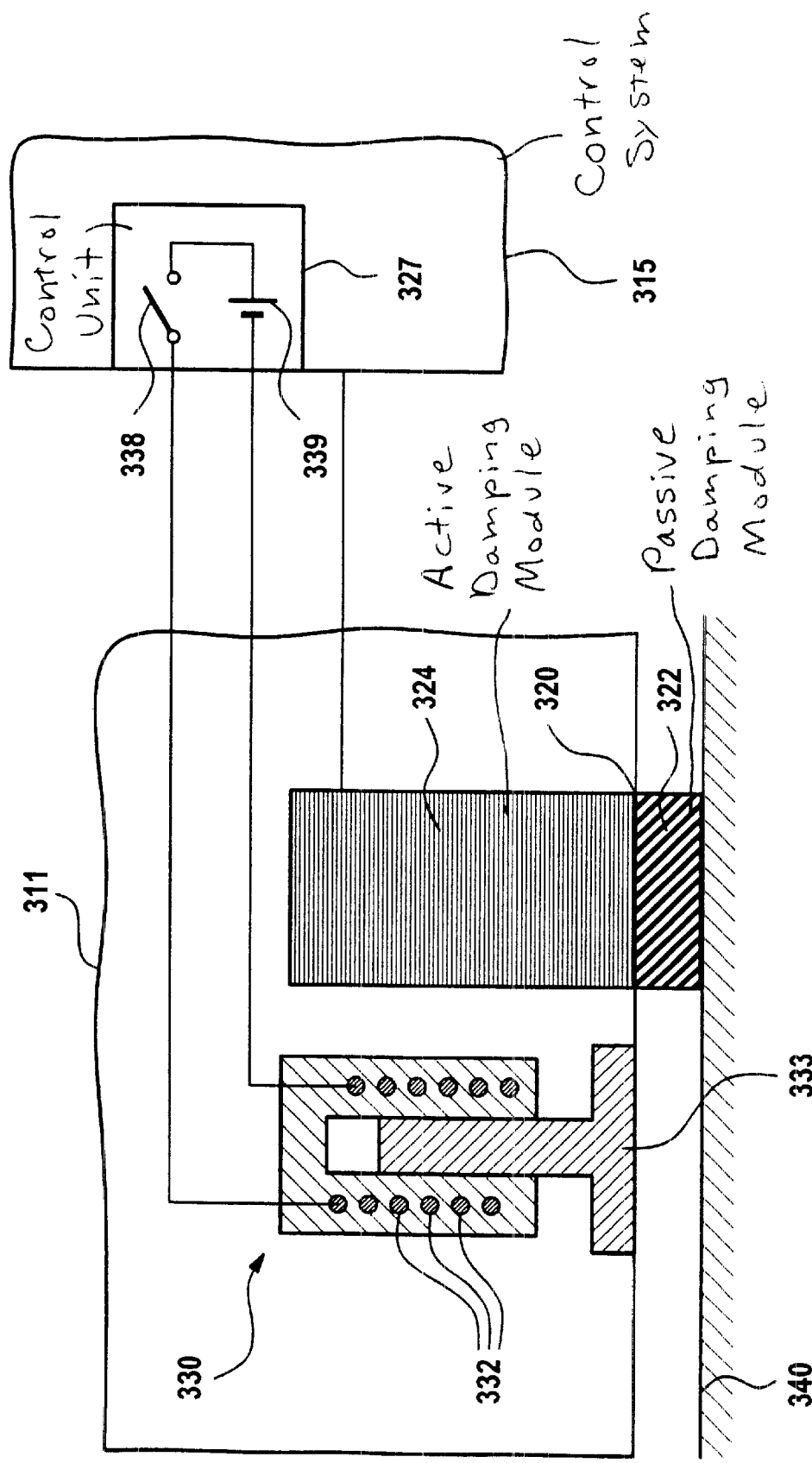
FIG. 3 is a diagram of a controllable damping mechanism with an actively controllable damping module and a fixing mechanism having a magnetic coil in accordance with the invention.

FIG. 3 shows a further exemplary embodiment of the invention having a controllable damping mechanism 320 with an actively controllable damping module 324 and a fixing mechanism 330 with a magnetic coil 332. The damping mechanism 320 and the fixing mechanism 330 are similar to the mechanisms 120 and 130 of FIGS. 1 and 2, being fashioned in four parts for connecting a basic unit 311 of a magnetic resonance apparatus to a floor 340 of an installation room of the magnetic resonance apparatus. Excerpts of one of the four parts of the mechanisms 320 and 330 are shown in FIG. 3.

As noted above, the fixing mechanism 330 has a displaceable plunger 333 as well as a magnetic coil 332. The plunger 333 is fashioned as a movable core of the magnetic coil 332, so that the plunger 333 can be extended with high pressure against the floor 340 or can be lifted away from the floor 340 by a suitable current to the magnetic coil 332, or the absence of a current. FIG. 3 shows the plunger 333 in a position lifted off from the floor 340. For the aforementioned application or non-application of current to the magnetic coil 332, the magnetic coil 332 is connected to a control unit 327 arranged in a control system 315 of the magnetic resonance apparatus. The control unit 327 has a voltage source 339 as well as a switch 338 with which the magnetic coil 332 can be connected to the voltage source 339 or can be separated therefrom for applying or not applying current.

The damping mechanism 320 includes the actively controllable damping module 324 composed, for example, of piezo-electric elements, and a passive damping module 322 of oscillation-damping material, particularly rubber. The passive damping module 322 has a resonant frequency tuned, for example, to approximately 15 Hz. In contrast the actively controlled damping module 324 is designed for damping oscillations in the frequency range between 1 and 40 Hz. The active damping module 324 is controllably connected to the control system 315 such that the damping mechanism 320 can react for highly effective damping to a changing frequency of the oscillation to be damped.

Figure 4:
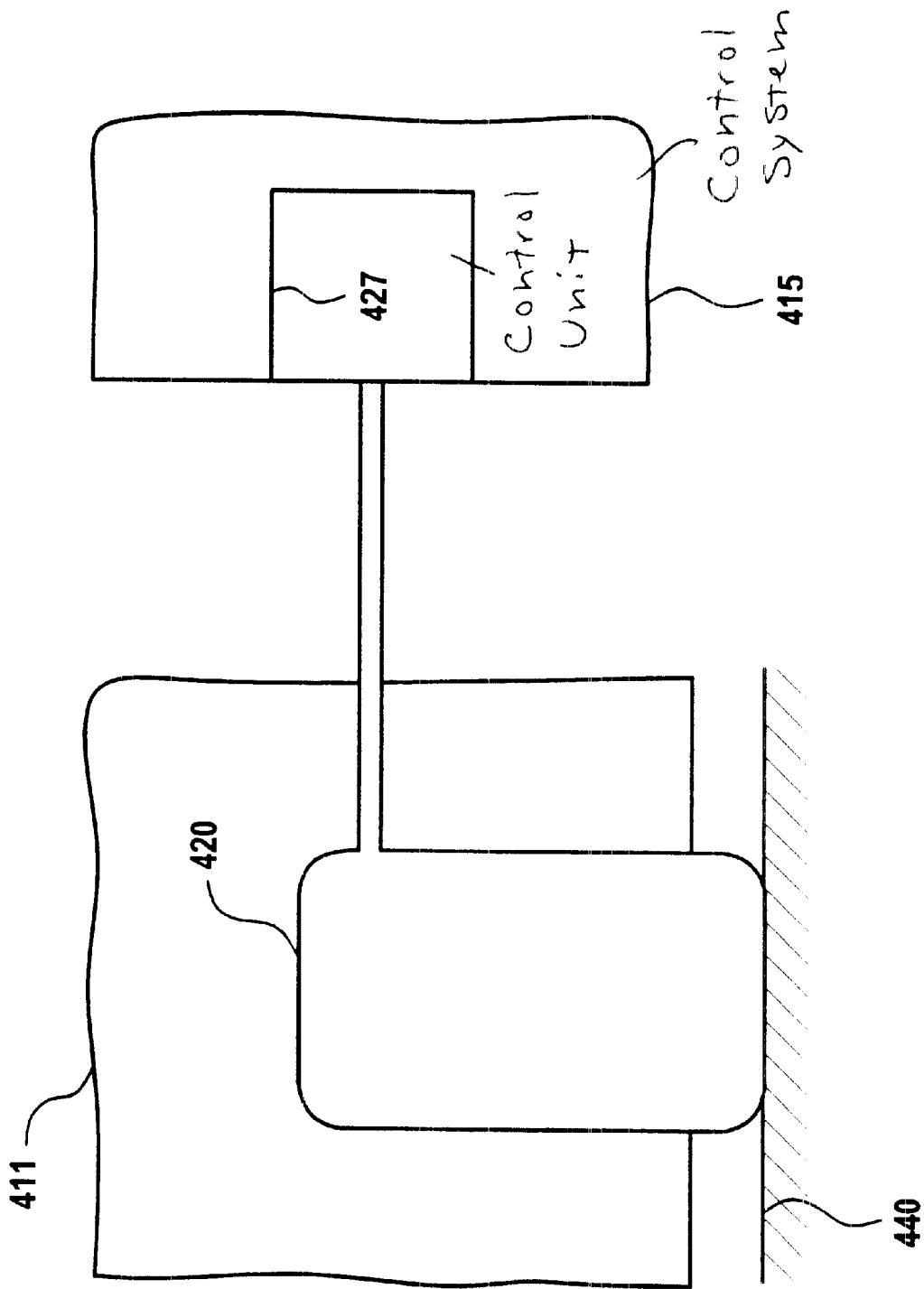
FIG. 4 is a diagram of a controllable damping mechanism in the form of an air cushion in accordance with the invention

As a further exemplary embodiment of the invention, FIG. 4 shows a diagram of a controllable damping mechanism 420 according to the air cushion principle. The damping mechanism 420 is fashioned of four parts for connecting a basic unit 411 of a magnetic resonance apparatus to the floor 440 of an installation room of the magnetic resonance apparatus, similar to the damping mechanism 120 in FIGS. 1 and 2. To that end, FIG. 4 shows portions of one of the four parts of the damping mechanism 420. The illustrated part of the damping mechanism 420 is essentially fashioned as an air cushion that is connected to a control unit 427 of a control 415 of the magnetic resonance apparatus for controlling the pressure within the cushion.

Figure 5:
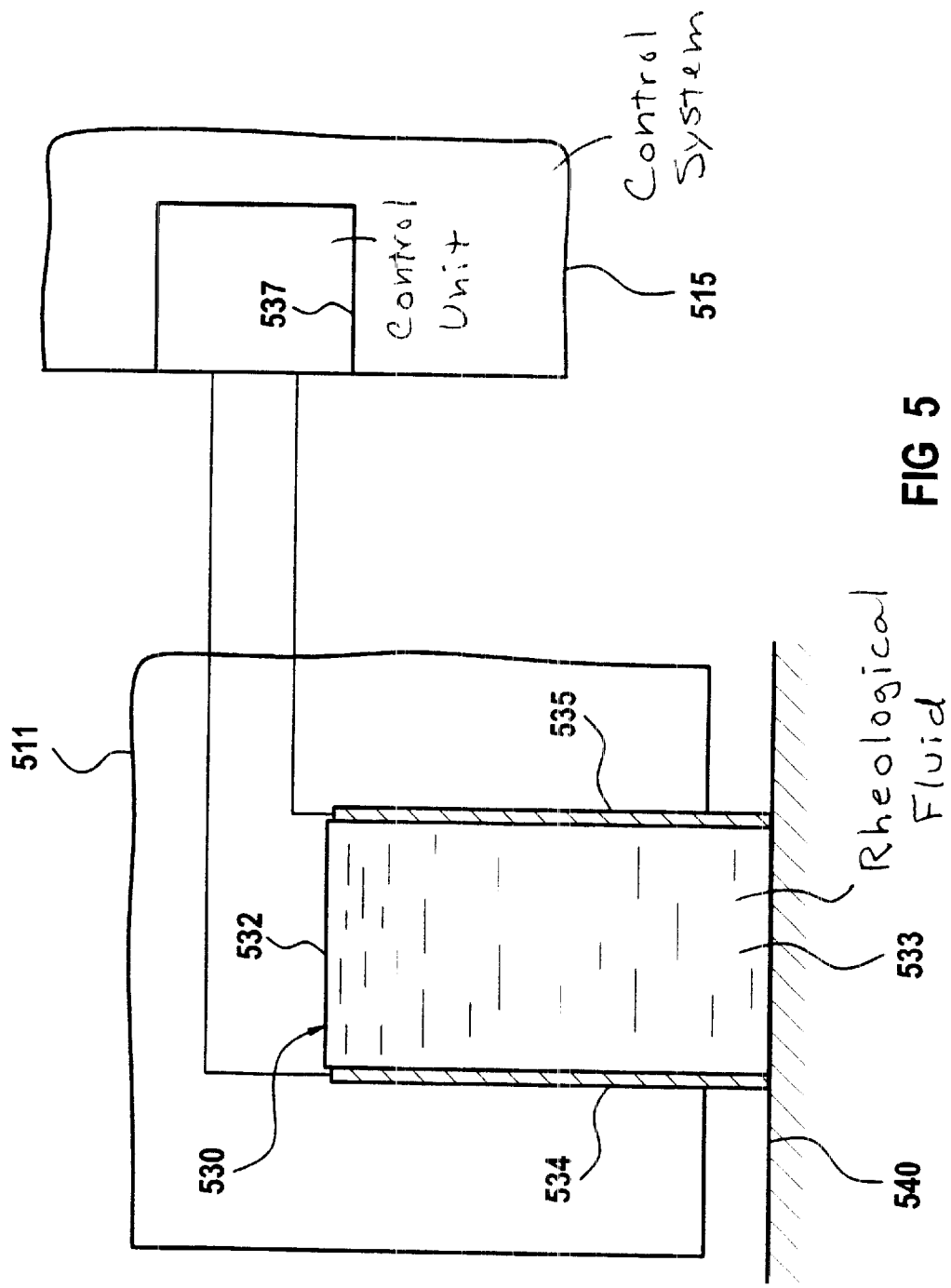
FIG. 5 is a diagram of a controllable mechanism having an electro-rheological fluid in accordance with the invention.

In another embodiment of the invention, FIG. 5 shows a controllable device 530 having an electro-rheological fluid 533 whose viscosity can b controlled by applying an electrical field. Similar to the mechanisms 120 and 130 of FIGS. 1 and 2, the controllable mechanism 530 is fashioned in four parts for connecting a basic unit 511 of a magnetic resonance apparatus to a floor 540 of an installation room of the magnetic resonance apparatus. FIG. 5 shows an excerpt of one of the four parts of the controllable mechanism 530.

The controllable mechanism 530 includes a vessel 532 for the fluid 533 and at least two electrodes 534 and 535 for generating the electrical field. In a first control status for the rigid and undamped connection of the basic unit 511 to the floor 530, the viscosity of the fluid 533 can be suitably controlled by applying an electrical voltage to the electrodes 534 and 535 via an accompanying electrical field between the electrodes 534 and 535.

In a second control status, the basic unit 511 is maintained isolated as to mechanical oscillations by the controllable mechanism 530 by a different electrical voltage is applied, so that the viscosity of the fluid 533 is optimum for damping, in particular, low-frequency mechanical oscillations. For suitable control of the electrical voltage between the electrodes 534 and 535, the electrodes 534 and 535 are connected to a control unit 537 arranged in a control system 515 of the magnetic resonance apparatus.

In another embodiment, the controllable mechanism 530 also can be utilized exclusively as a fixing mechanism in combination with a separate damping mechanism.

In another embodiment, the controllable mechanism 530 also can be fashioned and operated with a magneto-rheological fluid and an appertaining, controlling magnetic field instead of being fashioned and operated with an electro-rheological fluid 533 and the appertaining, controlling electrical field. The use of the electro-rheological and magneto-rheological fluids in vibration dampers is disclosed, for example by German OS 198 20 570.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
   an apparatus part susceptible to mechanical oscillations; and
   a controllable device interacting with said apparatus part which, in a first control state, mechanically fixes said apparatus part and, in a second control state, maintains said apparatus part isolated with respect to said mechanical oscillations.

2. A magnetic resonance apparatus as claimed in claim 1 wherein, in said second control state, said controllable device damps said mechanical oscillations in a range from approximately 1 through 40 Hz.

3. A magnetic resonance apparatus as claimed in claim 1 wherein said controllable device comprises an electro-rheological fluid having a viscosity, and an electric field source for applying an electric field to said electro-rheological fluid for controlling said viscosity.

4. A magnetic resonance apparatus as claimed in claim 1 wherein said controllable device comprises an magneto-rheological fluid having a viscosity, and a magnetic field source for applying a magnetic field to said magneto-rheological fluid for controlling said viscosity.

5. A magnetic resonance apparatus as claimed in claim 1 wherein said apparatus part is adapted to interact with an installation environment, and wherein said controllable device interacts with said apparatus part between said apparatus part and said installation environment.

6. A magnetic resonance apparatus as claimed in claim 5 wherein said apparatus part is adapted to interact with a floor of an installation room, and wherein said controllable device interacts with said apparatus part between said apparatus part and said floor.

7. A magnetic resonance apparatus as claimed in claim 1 wherein said apparatus part comprises a basic field magnet.

8. A magnetic resonance apparatus as claimed in claim 1 wherein said controllable device comprises a controllable mechanical fixing mechanism switchable between a mechanically fixing state, in said first control state, in said first control state and in a non-fixing state in said second control state.

9. A magnetic resonance apparatus as claimed in claim 8 wherein said fixing mechanism is a hydraulically operating fixing mechanism.

10. A magnetic resonance apparatus as claimed in claim 8 wherein said fixing mechanism is a pneumatically operating fixing mechanism.

11. A magnetic resonance apparatus as claimed in claim 8 wherein said fixing mechanism comprises a magnetic coil having a movable core, said magnetic coil being energizable and de-energizable for selectively displacing said movable core to mechanically fix said apparatus part and to isolate said apparatus part in said non-fixed state.

12. A magnetic resonance apparatus as claimed in claim 8 wherein said fixing mechanism comprises an extensible plunger.

13. A magnetic resonance apparatus as claimed in claim 1 wherein said controllable device comprises a damping device for isolating said apparatus part with respect to said mechanical oscillations.

14. A magnetic resonance apparatus as claimed in claim 13 wherein said damping device comprises a passive damping module.

15. A magnetic resonance apparatus as claimed in claim 14 wherein said passive damping module is comprised of rubber.

16. A magnetic resonance apparatus as claimed in claim 13 wherein said damping device comprises an actively controllable damping module.

17. A magnetic resonance apparatus as claimed in claim 16 wherein said actively controllable damping module comprises a piezoelectric element.

18. A magnetic resonance apparatus as claimed in claim 16 wherein said actively controllable damping module comprises an air cushion.

* * * * *